US008098113B2

(12) United States Patent
Alkan

(10) Patent No.: US 8,098,113 B2

(45) Date of Patent: Jan. 17, 2012

(54) SELF-TERMINATING COAXIAL CABLE PORT

(75) Inventor: Erdogan Alkan, Fayetteville, NY (US)

(73) Assignee: John Mezzalingua Associates, Inc., East Syracuse, NY (US)

( * ) Notice: Subject to any disclaimer, the term of this patent is extended or adjusted under 35 U.S.C. 154(b) by 361 days.

(21) Appl. No.: 12/576,480

(22) Filed: Oct. 9, 2009

(65) Prior Publication Data

US 2010/0301972 A1 Dec. 2, 2010

Related U.S. Application Data

(60) Provisional application No. 61/182,496, filed on May 29, 2009.

(51) Int. Cl.
*H03H 7/38* (2006.01)
*H01P 1/24* (2006.01)

(52) U.S. Cl. ..................................... 333/22 R; 333/17.3

(58) Field of Classification Search ................. 333/17.3, 333/33, 22 R
See application file for complete search history.

(56) References Cited

U.S. PATENT DOCUMENTS

| | | | |
|---|---|---|---|
| 3,790,909 | A | 2/1974 | Le Fevre |
| 4,477,812 | A | 10/1984 | Frisbee, Jr. et al. |
| 4,512,033 | A | 4/1985 | Schrock |
| 4,520,508 | A | 5/1985 | Reichert, Jr. |
| 4,648,123 | A | 3/1987 | Schrock |
| 4,677,390 | A | 6/1987 | Wagner |
| 4,961,218 | A | 10/1990 | Kiko |
| 4,982,440 | A | 1/1991 | Dufresne et al. |
| 5,010,399 | A | 4/1991 | Goodman et al. |
| 5,126,840 | A | 6/1992 | Dufresne et al. |
| 5,214,505 | A | 5/1993 | Rabowsky et al. |
| 5,231,660 | A | 7/1993 | West, Jr. |
| 5,369,642 | A | 11/1994 | Shioka et al. |
| 5,548,255 | A | 8/1996 | Spielman |
| 5,745,836 | A | 4/1998 | Williams |
| 5,815,794 | A | 9/1998 | Williams |
| 5,839,052 | A | 11/1998 | Dean et al. |
| 5,893,024 | A | 4/1999 | Sanders et al. |
| 5,937,330 | A | 8/1999 | Vince et al. |

(Continued)

FOREIGN PATENT DOCUMENTS

JP 55080989 A 6/1980

(Continued)

OTHER PUBLICATIONS

PCT/US2010/036701. International Search Report and Written Opinion. Date of Mailing: Dec. 29, 2010. 8 pp.

(Continued)

*Primary Examiner* — Stephen Jones

(74) *Attorney, Agent, or Firm* — Schmeiser Olsen & Watts

(57) ABSTRACT

A circuit for automatically terminating a user port in a coaxial cable system includes a signal path extending from a user-side port toward a supplier-side port, the signal path including a conductor and a ground. The user-side port is adapted to connect to a user device. The circuit further includes a passive signal sampler coupled to the signal path, and a comparator element in communication with the passive signal sampler. The comparator is adapted to compare a line signal on the signal path to a reference signal and generate an output. A switch disposed in the signal path has a first state for terminating the line signal and a second state for passing the line signal. The first state and the second state are responsive to the output generated from the comparator.

35 Claims, 5 Drawing Sheets

U.S. PATENT DOCUMENTS

| | | | |
|---|---|---|---|
| 5,950,111 | A | 9/1999 | Georger et al. |
| 5,970,053 | A | 10/1999 | Schick et al. |
| 6,014,547 | A | 1/2000 | Caporizzo et al. |
| 6,049,693 | A | 4/2000 | Baran et al. |
| 6,069,960 | A | 5/2000 | Mizukami et al. |
| 6,094,211 | A | 7/2000 | Baran et al. |
| 6,205,138 | B1 | 3/2001 | Nihal et al. |
| 6,348,837 | B1 | 2/2002 | Ibelings |
| 6,348,955 | B1 | 2/2002 | Tait |
| 6,373,349 | B2 | 4/2002 | Gilbert |
| 6,377,316 | B1 | 4/2002 | Mycynek et al. |
| 6,388,539 | B1 | 5/2002 | Rice |
| 6,425,132 | B1 | 7/2002 | Chappell |
| 6,495,998 | B1 | 12/2002 | Terreault |
| 6,498,925 | B1 | 12/2002 | Tauchi |
| 6,510,152 | B1 | 1/2003 | Gerszberg et al. |
| 6,560,778 | B1 | 5/2003 | Hasegawa |
| 6,570,928 | B1 | 5/2003 | Shibata |
| 6,587,012 | B1 | 7/2003 | Farmer et al. |
| 6,622,304 | B1 | 9/2003 | Carhart |
| 6,640,338 | B1 | 10/2003 | Shibata |
| 6,674,809 | B1 | 1/2004 | Kay |
| 6,678,893 | B1 | 1/2004 | Jung |
| 6,683,513 | B2 | 1/2004 | Shamsaifar et al. |
| 6,725,462 | B1 | 4/2004 | Kaplan |
| 6,728,968 | B1 | 4/2004 | Abe et al. |
| 6,757,910 | B1 | 6/2004 | Bianu |
| 6,804,828 | B1 | 10/2004 | Shibata |
| 6,845,232 | B2 | 1/2005 | Darabi |
| 6,877,166 | B1 | 4/2005 | Roeck et al. |
| 6,928,175 | B1 | 8/2005 | Bader et al. |
| 7,003,275 | B1 | 2/2006 | Petrovic |
| 7,029,293 | B2 | 4/2006 | Shapson et al. |
| 7,039,432 | B2 | 5/2006 | Strater et al. |
| 7,162,731 | B2 | 1/2007 | Reidhead et al. |
| 7,283,479 | B2 | 10/2007 | Ljungdahl et al. |
| 7,454,252 | B2 | 11/2008 | El-Sayed |
| 7,505,819 | B2 | 3/2009 | El-Sayed |
| 7,530,091 | B2 | 5/2009 | Vaughan |
| 2001/0016950 | A1 | 8/2001 | Matsuura |
| 2002/0141347 | A1 | 10/2002 | Harp et al. |
| 2002/0144292 | A1 | 10/2002 | Uemura et al. |
| 2002/0166124 | A1 | 11/2002 | Gurantz et al. |
| 2004/0172659 | A1 | 9/2004 | Ljungdahl et al. |
| 2004/0212481 | A1 | 10/2004 | Abraham |
| 2004/0229561 | A1 | 11/2004 | Cowley et al. |
| 2005/0034168 | A1 | 2/2005 | Beveridge |
| 2005/0183130 | A1 | 8/2005 | Sadja et al. |
| 2005/0283815 | A1 | 12/2005 | Brooks et al. |
| 2005/0289632 | A1 | 12/2005 | Brooks et al. |
| 2006/0015921 | A1 | 1/2006 | Vaughan |
| 2006/0205442 | A1 | 9/2006 | Phillips et al. |
| 2006/0282871 | A1 | 12/2006 | Yo |
| 2007/0288981 | A1 | 12/2007 | Mitsuse et al. |
| 2007/0288982 | A1 | 12/2007 | Donahue |
| 2008/0022344 | A1 | 1/2008 | Riggsby |
| 2008/0040764 | A1 | 2/2008 | Weinstein et al. |
| 2008/0127287 | A1 | 5/2008 | Alkan et al. |
| 2009/0031391 | A1 | 1/2009 | Urbanek |
| 2009/0047917 | A1 | 2/2009 | Phillips et al. |
| 2009/0077608 | A1 | 3/2009 | Romerein et al. |

FOREIGN PATENT DOCUMENTS

| | | | |
|---|---|---|---|
| JP | 55132126 | A | 10/1980 |
| JP | 57091055 | A | 6/1982 |
| JP | 58101582 | U | 6/1983 |
| JP | 05899913 | | 7/1983 |
| JP | 61157035 | A | 7/1986 |
| JP | 05191416 | A | 7/1993 |
| JP | 07038580 | A | 2/1995 |
| JP | 11069334 | A | 3/1999 |
| JP | 2001177580 | A | 6/2001 |
| JP | 2004080483 | A | 3/2004 |
| JP | 2005005875 | A | 1/2005 |
| JP | 2007166109 | A | 6/2007 |
| JP | 2007166110 | A | 6/2007 |
| KR | 10-0462149 | B1 | 12/2004 |
| WO | WO-0024124 | A1 | 4/2000 |
| WO | WO-0172005 | A1 | 9/2001 |
| WO | WO-0233969 | A1 | 4/2002 |
| WO | WO-02091676 | A1 | 11/2002 |

OTHER PUBLICATIONS

Preventing ingress in the return path by Kevin J. Oliver, Product Marketing Manager, CATV Division, Wavetek Corp; CedMagazine.com; Oct. 1, 1996; http://www.cedmagazine.com/preventing-ingress-in-the-return.aspx; 3 pgs.

SELF-TERMINATING COAXIAL CABLE PORT

CROSS REFERENCE TO RELATED APPLICATION

Reference is made to and this application claims priority from and the benefit of U.S. Provisional Application Ser. No. 61/182,496, filed May 29, 2009, entitled “AUTOMATIC TERMINATING PORT”, which application is incorporated herein in its entirety by reference.

FIELD OF THE INVENTION

The present invention relates generally to bi-directional community antenna television (“CATV”) networks, and more specifically, to systems and methods for mitigating upstream noise ingress resulting from radio frequency electromagnetic signals entering the CATV network through improperly terminated tap ports, splitter ports, and wall ports.

BACKGROUND OF THE INVENTION

A typical CATV network provides many content selections to a subscriber’s media device by way of a single electrically conductive cable that provides a signal stream to the media device. A typical CATV or cable television network includes a head end facility from which a plurality of feeder cable lines emanate. The feeder cable lines branch off at a tap having ports. A drop cable, which may be a single coaxial cable, extends from each port to a respective user unit, or user. The CATV system is a two-way communication system. A downstream bandwidth carries signals from the head end to a user and an upstream bandwidth carries upstream signals from the user to the head end.

One example of such a system is a bidirectional CATV system with a head end controlled by a system operator and with a plurality of users’ televisions equipped with set top boxes or cable modems. Downstream bandwidth of the CATV system may include broadcast television channels, video on demand services, internet data, home security services, and voice over internet (VoIP) services. Upstream bandwidth may include data related to video on demand, internet access, security monitoring, or other services provided by the system operator. In one possible configuration, the upstream and downstream bandwidths are transmitted between the head end and the tap via optical fiber, and between the tap and the user via coaxial cable. Upstream and downstream bandwidths are typically transmitted via oscillatory electrical signals propagated along the cable lines in a discrete frequency range, or channel, that is distinct from the frequency ranges of other content selections. Downstream bandwidth frequencies typically range from 50-1,000 megahertz (MHz), and upstream bandwidth frequencies typically range from 7-49 MHz.

Each drop cable entering a user’s dwelling usually enters a splitter having multiple outlet ports. Distribution cables connected to the outlet ports route the signals to various rooms, often terminating at a wall jack. In many installations, the distribution cable is split again, depending on component setup. The network of distribution cables, splitters, and distribution points is referred to as a drop system. Within the drop system, not every port on a splitter may be utilized, and not every wall jack within a structure may have a device connected to it.

One problem with the un-terminated splitters and wall jacks is that users unwittingly allow a significant level of radio frequency noise, or ingress noise, to enter the network and be passed along the upstream bandwidth. Unbeknownst to most users, the exposed port in a splitter or wall jack acts as an antenna, collecting radio frequency noise from sources such as electrical devices with alternating electrical currents. Examples of electrical devices that create radio frequency noise include garbage disposals, vacuum cleaners, microwave ovens, etc. Commonly used devices transmitting signals in the radio frequency range may also contribute to the ingress noise picked up by the exposed port in a splitter or wall jack and transmitted through the upstream bandwidth. Such devices include cell phones, wireless networks, baby monitors, and the like.

Radio frequency noise may also enter the upstream bandwidth of a CATV system if a connector is loose or cracked, if the coaxial cable is damaged, or if there is a malfunctioning user device in the drop system. As used herein, the term “ingress noise” means all such sources of radio frequency noise and includes (but is not limited to) open ports, loose connectors, un-terminated splitters, and poor performing splitters.

The ingress noise passing from each user to the upstream bandwidth “funnels” at the tap, where it is combined with ingress noise from other users. The additive effect of ingress noise passing from hundreds or thousands of users to the upstream bandwidth is a serious problem plaguing the cable television industry. Unlike noise accumulated in the downstream bandwidth, which manifests itself as progressively deteriorating picture quality, ingress noise in the upstream bandwidth may not be detected until communication breaks down completely or, in the case of spread spectrum technology, drastically slows down network performance. Experts estimate that approximately 95 percent of ingress noise originates from the drop system, including the user dwelling. Oliver, Kevin J. “Preventing Ingress in the Return Path.” CedMagazine.com. Oct. 1, 1996. <http://cedmagazine.com/preventing-ingress-in-the-return.aspx>. Unfortunately, the cable television industry has little control of the drop system architecture within a user dwelling. The drop system is the least accessible and least controllable portion of the CATV network. Thus, any attempt to properly terminate the exposed ports and wall jacks would probably be futile.

SUMMARY OF THE INVENTION

The present invention provides a circuit for automatically terminating a user port in a coaxial cable system when no device is connected to the port, or when a device is improperly connected to the port. The invention mitigates radio frequency ingress noise caused by un-terminated or damaged user ports. The circuit includes a signal path extending from a user-side port toward a supplier-side port. The signal path includes a conductor and a ground. The user-side port is adapted to connect to a user device. The circuit further includes a passive signal sampler coupled to the signal path, and a comparator element in communication with the passive signal sampler. The comparator is adapted to compare a line signal on the signal path to a reference signal and generate an output. A switch disposed in the signal path has a first state for terminating the line signal and a second state for passing the line signal. The first state and the second state are responsive to the output generated from the comparator.

BRIEF DESCRIPTION OF THE DRAWINGS

The novel features that are characteristic of the preferred embodiment of the invention are set forth with particularity in the claims. The invention itself may be best be understood, with respect to its organization and method of operation, with reference to the following description taken in connection with the accompanying drawings in which:

DETAILED DESCRIPTION OF THE PREFERRED EMBODIMENT

Figure 1:
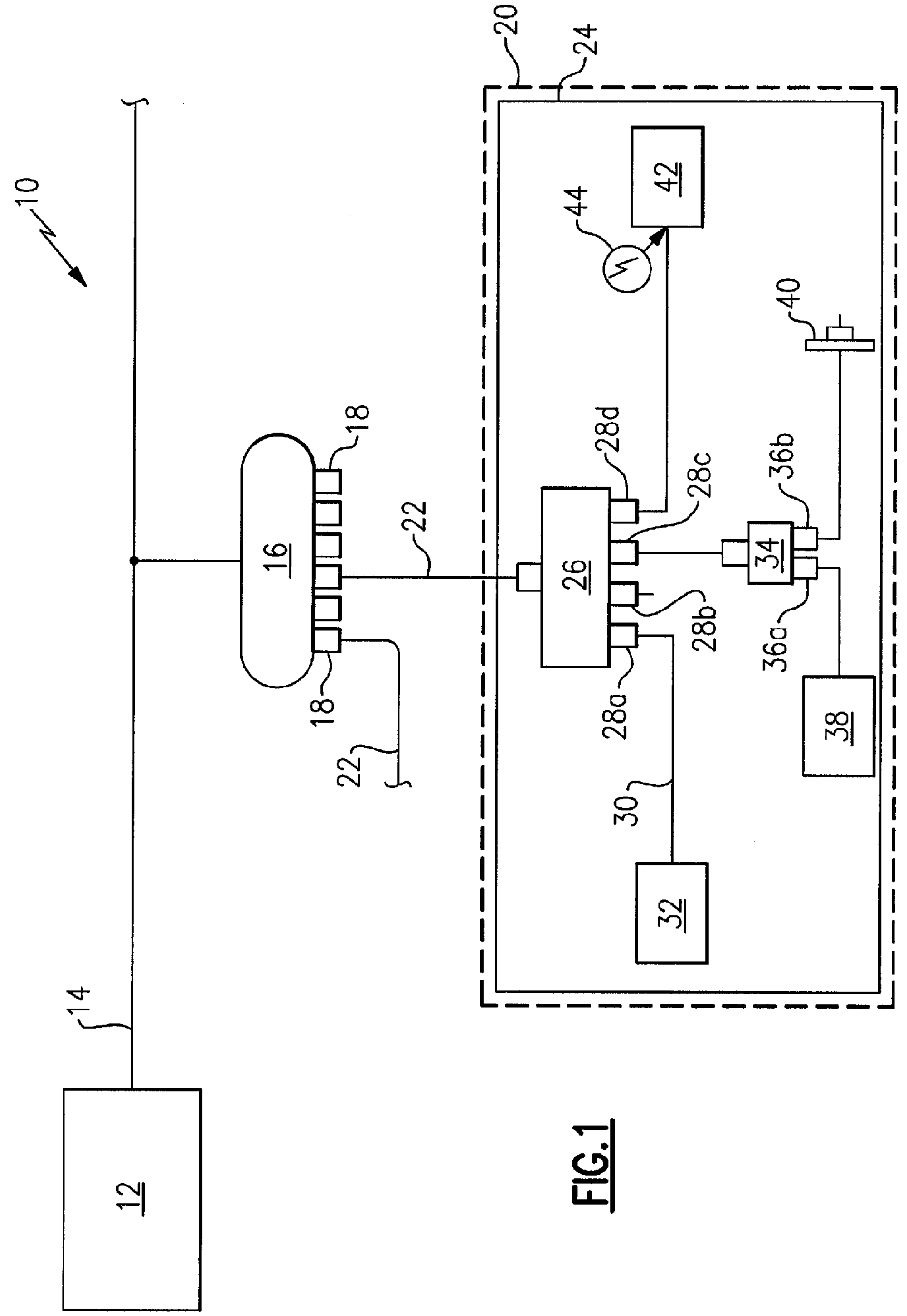
FIG. 1 shows a simplified schematic view of a CATV network showing potential locations to block ingress noise, according to one embodiment of the invention.

Referring to the simple schematic of FIG. 1, a portion of a CATV or cable television network 10 includes a head end facility 12 for processing and distributing signals over the network. Typically the head end facility 12 is controlled by a system operator and includes electronic equipment to receive and re-transmit video and other signals over the local cable infrastructure. One or more main distribution lines 14 carry the downstream bandwidth from the head end facility 12 to a tap 16 configured to serve a local distribution network of about 100 to 250 end users or subscribers. The tap 16 includes a plurality of tap ports 18 which are configured to carry the downstream bandwidth to a user's drop system 20 via a drop cable 22, which may be a single coaxial cable.

The drop cable 22 typically enters a user's dwelling 24 and connects to a first splitter 26. In the disclosed embodiment, the first splitter 26 is a four-way splitter having four distribution ports 28*a*-28*d*. A coaxial cable 30 connects port 28*a* to a first user device 32, which may be set top box, for example. Port 28*b* is shown as an open port; meaning there is no device connected to it. Port 28*c* is shown connected via coaxial cable to a second splitter 34. The second signal splitter 34 is illustrated as a two-way splitter having two distribution ports 36*a* and 36*b*. Port 36*a* is connected to a second user device 38, which may be a cable modem. Port 36*b* is connected via coaxial cable to a wall jack 40. In the illustrated example, the wall jack 40 is an un-terminated port, meaning there is no device connected to it. Port 28*d* is connected via coaxial cable to a third user device 42, which may be a digital telephone supporting voice-over-internet protocol. In the illustrated example, the connection 44 to the third user device 42 is loose or cracked.

The illustrated drop system 20 has numerous sources for ingress noise feeding back to the upstream bandwidth. One such source is the open splitter distribution port 28*b*. Another possible source of ingress noise is the un-terminated wall jack 40 having an exposed center conductor wire protruding from the connector in the wall. A third example is the loose or cracked fitting 44 on the third user device 42. Although the device 42 is connected such that it receives a downstream bandwidth, the improper connection may hamper or even prevent the upstream bandwidth from reaching the head end facility 12.

Another possible source for ingress noise is illustrated at the tap 16. Unused tap ports 18 that have not been properly capped or terminated may cause ingress noise in much the same manner as the distribution ports 28, 36.

The drop system 20, and to some extent the tap 16, are difficult to access and control by the cable service providers. As stated above, experts have concluded ingress noise from drop system accounts for about 95 percent of system noise. The inventor has recognized the need to passively detect a properly connected device at the user port and, in the absence of such detection, open a switch to cut off the signal to the port, thereby eliminating any ingress noise to the upstream bandwidth. In one embodiment, connecting a device to the port closes the switch to restore the passing of the downstream bandwidth to the user-side port.

Figure 2:
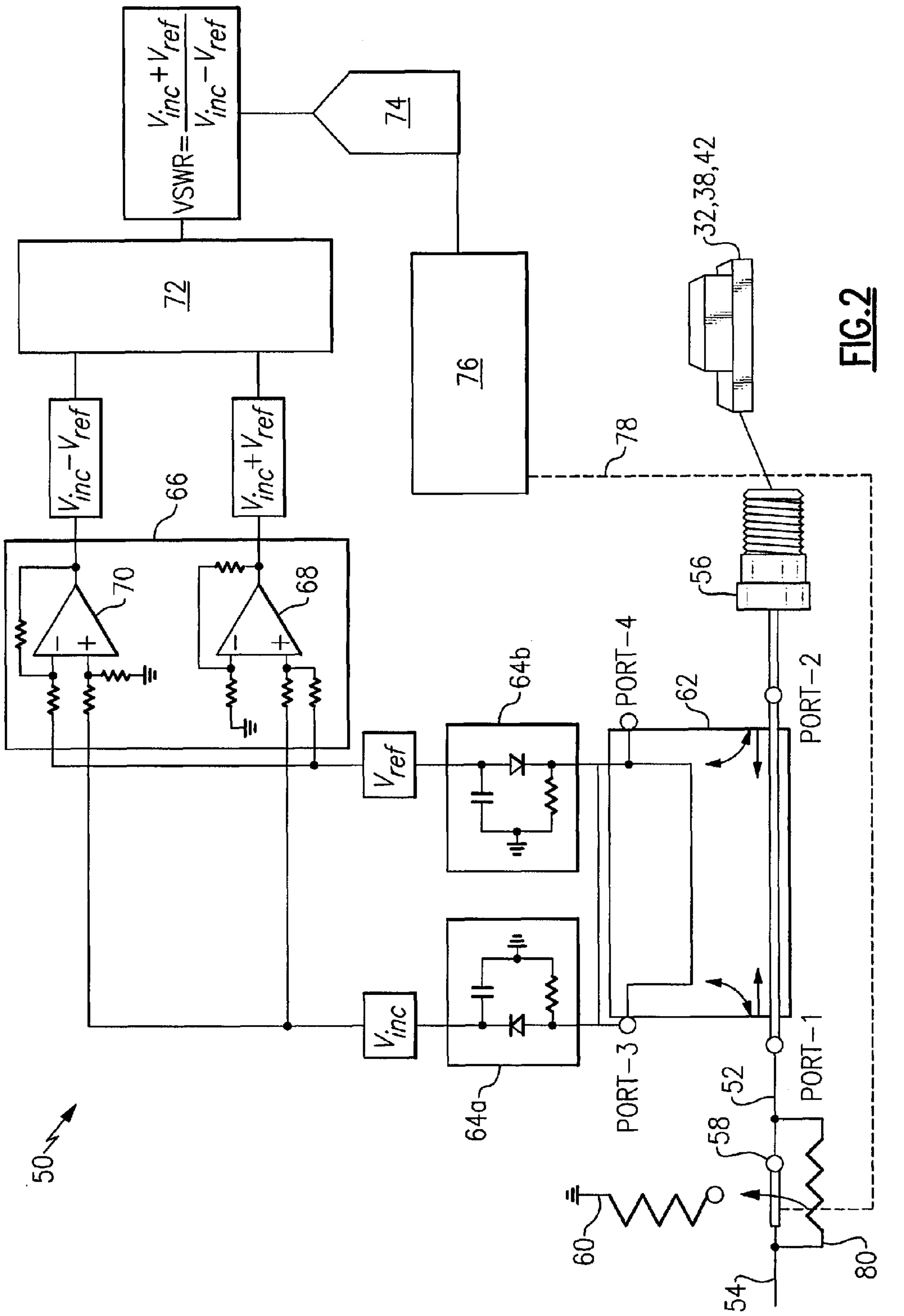
FIG. 2 shows a schematic diagram of an automatically terminating circuit according to one embodiment of the invention.

Referring to FIG. 2 of the drawings, a circuit 50 for automatically terminating a user port in a coaxial cable system includes a signal path 52 extending from a supplier-side port 54 through an output of a user-side port 56. Referring back to FIG. 1, in one example the supplier-side port 54 is the drop cable 22. The user-side port 56 may be any of the illustrated distribution ports 28*a*-28*d*, 36*a*, 36*b*, or the wall jack 40. In another example, the user-side port 56 may be the main distribution line 14, and the user-side port 56 may be any of the tap ports 18 on the tap 16. The signal path 52 includes a conductor, such as the center conductor in a coaxial cable, to carry the upstream and downstream bandwidth. The signal path 52 further includes a ground, such as the outer sheath of a coaxial cable that provides a path to ground with various cable connector devices.

Returning to FIG. 2, the circuit 50 further includes an electrically-controlled switch 58 disposed in the signal path 52. In the illustrated example, the switch 58 is a single pole, single throw switch. The switch 58 is configured with at least a first state and a second state. In the illustrated example, the first state is an open state and the second state is a closed state. In the open state, which will be utilized when there is no connection or an improper connection at the user-side port 56, the switch 58 disrupts the signal path 52 and directs the downstream bandwidth to ground. In the disclosed embodiment, the ground path includes a termination resistor 60. The termination resistor 60 may be configured to match the impedance of the line load so as to prevent reflections due to impedance mismatch. In the illustrated example, the line load is 75 ohms, and the termination resistor 60 is likewise 75 ohms. In other embodiments, such as a base station connected to a transmission tower using coaxial cable, the line load may be 50 ohms and the termination resistor 60 may also be 50 ohms.

The closed state of the switch 58, which will be utilized when there is a proper connection at the user-side port 56, allows the forward path and upstream bandwidths to flow through the signal path 52 uninterrupted.

The circuit 50 further includes a passive signal sampler 62 to passively sample the downstream bandwidth. As used herein, "passively sample" is defined as using existing signals in the communication path as opposed to injecting an electrical signal to a communication port. In the disclosed embodiment, the passive signal sampler 62 is a four-port bi-directional coupler. The downstream bandwidth is received through port 1, the input port, and passes through port 2, the transmitted port. Some of the downstream bandwidth will be reflected at the user-side port 56, especially if a user device is not connected. The reflected downstream bandwidth is received through port 2 and is coupled to and output from port 4, the reverse coupled port. The bi-directional coupler may be selected such that a negligible amount of power is tapped from the downstream bandwidth. For example, one possible bi-directional coupler is rated at 10 dB, and reduces the input power by approximately 10 percent at port 2, the transmitted port. In another example, a bi-directional coupler is rated at 20 dB, and reduces the input power by approximately 1 percent. Other bi-directional couplers are contemplated, so long as the input power is not detrimentally decreased, and the coupled power is enough to perform a comparing function, as will be explained below.

The output from ports 3 and 4 of the passive signal sampler 62 may pass through a rectifier 64 prior to input to a comparator element 66. In the illustrated example, the voltage output of the forward coupled port (e.g., port 3) passes through the half-wave rectifier 64*a*. The output from the rectifier 64*a* may be a pulsed dc square wave, for example, having an incident voltage value ($V_{inc}$) characteristic of the peak voltage value of the downstream bandwidth.

In the event a user device is properly connected to the user-side port 56, a portion of the downstream bandwidth will be reflected. Examples of user devices include the cable box 32, the cable modem 38, and the digital telephone 42 in FIG. 1. The reflected signal may be sampled by the passive signal sampler 62 at port 4, for example. The voltage output of the reverse coupled port (e.g., port 4) passes through a half-wave rectifier 64*b*. The output from the rectifier 64*b* may be a pulsed dc square wave, for example, having a reflected voltage value ($V_{ref}$) characteristic of the peak voltage value of the reflected signal.

In the disclosed embodiment, the incident voltage value $V_{inc}$ and the reflected voltage value $V_{ref}$ are input to the comparator element 66. The comparator element 66 compares the reflected voltage value to the incident voltage value (e.g., the reference signal) and determines a voltage standing wave ratio (VSWR) according to the formula:

$$VSWR = \frac{V_{inc} + V_{ref}}{V_{inc} - V_{ref}} \quad (1)$$

In the illustrated example the value ($V_{inc}+V_{ref}$) is determined using a summing amplifier 68 as shown in FIG. 2, and the value ($V_{inc}-V_{ref}$) is determined using a difference amplifier 70. The two resultant voltage values are input to an analog divider 72, for example, to determine the voltage standing wave ratio. In one example, the output of the analog divider 72 is passed through an analog-to-digital converter 74, the digital output of which is utilized by a microcontroller 76 in determining whether the switch 58 should be open or closed, as will be explained below.

The voltage standing wave ratio is a parameter that shows the matching condition of a radio frequency system, and is therefore a useful calculation in determining whether a user device is properly connected to the user-side port 56. In the event there is no user device connected to the user-side port 56, virtually the entire signal is reflected back and detected at the passive signal sampler 62. Since the incident and reflected voltage values are nearly identical, the value of ($V_{inc}-V_{ref}$) approaches zero and the VSWR value becomes very large, approaching infinity. Conversely, when a user device is properly connected at the user-side port 56, e.g., impedance-matched, the reflected voltage will be nearly zero, and the VSWR value very nearly equals 1. In the event the user device is improperly connected, for example by loose or cracked connection, some incident voltage will be reflected, and the VSWR value will be greater than 1, but significantly less than infinity.

The microcontroller 76 may be programmed to relay a signal 78 responsive to the value of the VSWR output from the comparator element 66. The signal 78 commands the switch 58 to the open state or the closed state. In one illustrative example, the range of VSWR values is stored in a lookup table in the memory of the microcontroller 76, as well as a set of corresponding instructions for each value. In the example, an actual VSWR value, as output from the analog-to-digital converter 74, having a value between 1.0 and 1.5 will result in the switch 58 remaining closed, while VSWR values greater than 1.5 indicate high signal reflectance and a command will be sent to open the switch 58 and terminate the downstream bandwidth.

In one embodiment, a feeding resistor 80 is disposed in the signal path 52 in parallel with the switch 58. In the event no user device is connected to the user-side port 56 and the switch 58 is open, the feeding resistor 80 allows a small portion of the downstream bandwidth, 20 dB in one example, to pass through the input port of the bi-directional coupler. In this manner, the passive signal sampler 62 is continuously monitoring the downstream bandwidth and analyzing the reflected signal. Careful selection of the resistance value for the feeding resistor 80 will attenuate ingress noise and the reflected signal, and prevent them from feeding back to the main distribution line 14 and head end facility 12. When a user device is subsequently connected to the user-side port 56, the characteristics of the reflected signal change dramatically, the VSWR value drops significantly, and the microcontroller 76 commands the switch 58 to the open state.

Figure 3A:
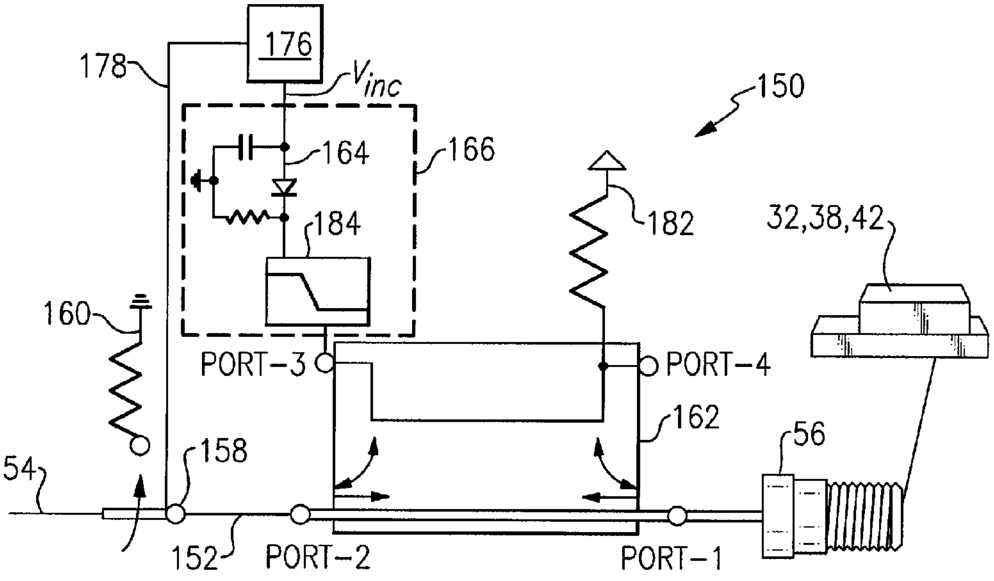
FIG. 3A shows a schematic diagram of an automatically terminating circuit according to a second embodiment of the invention.

Referring now to FIG. 3A of the drawings, wherein like numerals indicate like elements from FIG. 2, a circuit 150 for automatically terminating a user port in a coaxial cable system is shown wherein the upstream bandwidth is monitored. The circuit 150 includes a signal path 152 extending from the supplier-side port 54 through an output of the user-side port 56. The signal path 152 includes a conductor and a ground. The conductor may be the center conductor in a coaxial cable, and the ground may be the outer sheath of a coaxial cable, which further provides a path to ground with various other cable connector devices. Together, the conductor and ground provide a low loss waveguide feature to carry the upstream and downstream bandwidth. The circuit 150 further includes a switch 158 and a termination resistor 160, as detailed with respect to FIG. 2.

The circuit 150 further includes a passive signal sampler 162 to sample the upstream bandwidth. In the disclosed embodiment, the passive signal sampler 162 is a four-port directional coupler. The upstream bandwidth is received through port 1, the input port, and passes through port 2, the transmitted port. A small portion of the upstream bandwidth is coupled to and output from port 3, the coupled port. Port 4 is an isolated port, and is terminated with a second termination resistor 182 having a resistance value matched to the impedance of the circuit 150. In the illustrated example, the resistance value is 75 ohms.

The circuit 150 further includes a comparator element 166 in series with the output signal from the coupled port of the passive signal sampler 162 (e.g., port 3). In the illustrated example, the output from port 3 is compared with the reference to ground (e.g., port 4). The comparator element 166 includes a low pass filter 184 and a half-wave rectifier 164. The low pass filter 184 assures that only legitimate upstream bandwidths are passed through, usually in the range of 7-49 MHz. The rectifier 164 converts the radio frequency signal to a pulsed dc square wave, for example, having an incident voltage value ($V_{inc}$) characteristic of the peak voltage value of the upstream bandwidth. Although not shown, the signal may further be conditioned through an amplifier and/or analog-to-digital converter.

The signal passing from the rectifier 164 inputs to a microcontroller 176. The microcontroller 176 may be programmed to relay a signal 178 to the switch 158 responsive to the output of the comparator element 166. In the disclosed example, if there is no user device connected to the user-side port 56, there will be no upstream bandwidth, and the incident voltage value $V_{inc}$ will be zero. In that event, the microcontroller 176 may be programmed to command the switch 158 to the open state. When a user device such as a cable box 32 is subsequently connected to the user-side port 56, an upstream bandwidth may be generated and the incident voltage value $V_{inc}$ will be a non-zero value. The microcontroller 176 may thus be programmed to command the switch 158 to the closed state, allowing the downstream bandwidth to proceed to the user device. Note that the feeding resistor across switch 158 is not needed in circuit 150.

Figure 3B:
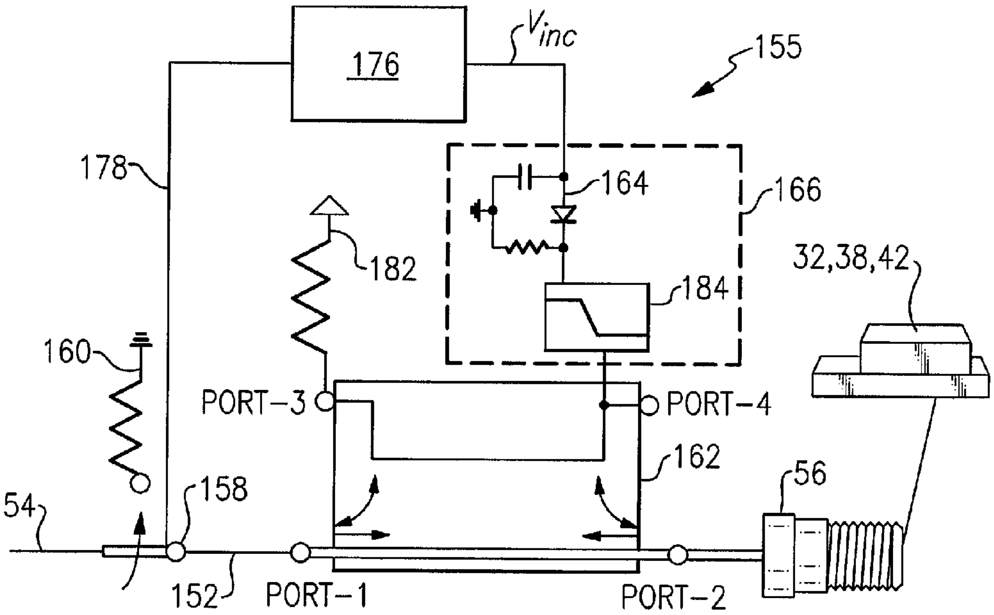
FIG. 3B shows a schematic diagram of an automatically terminating circuit according to an alternate configuration of the second embodiment of the invention.

Those skilled in the art would appreciate that the directional coupler disclosed herein may alternately be coupled to the reflected upstream bandwidth without departing from the scope of the invention. Referring to FIG. 3B, a circuit 155 is shown configured to passively sample the reflected upstream bandwidth. The signal is incident at port 1, and passes through at port 3. The reflected coupled output is illustrated at port 3, and the isolated port is port 4. In this configuration, the directional coupler would operate in the same manner, coupling to the reflected upstream bandwidth rather than the upstream bandwidth as shown in FIG. 3A.

Figure 4:
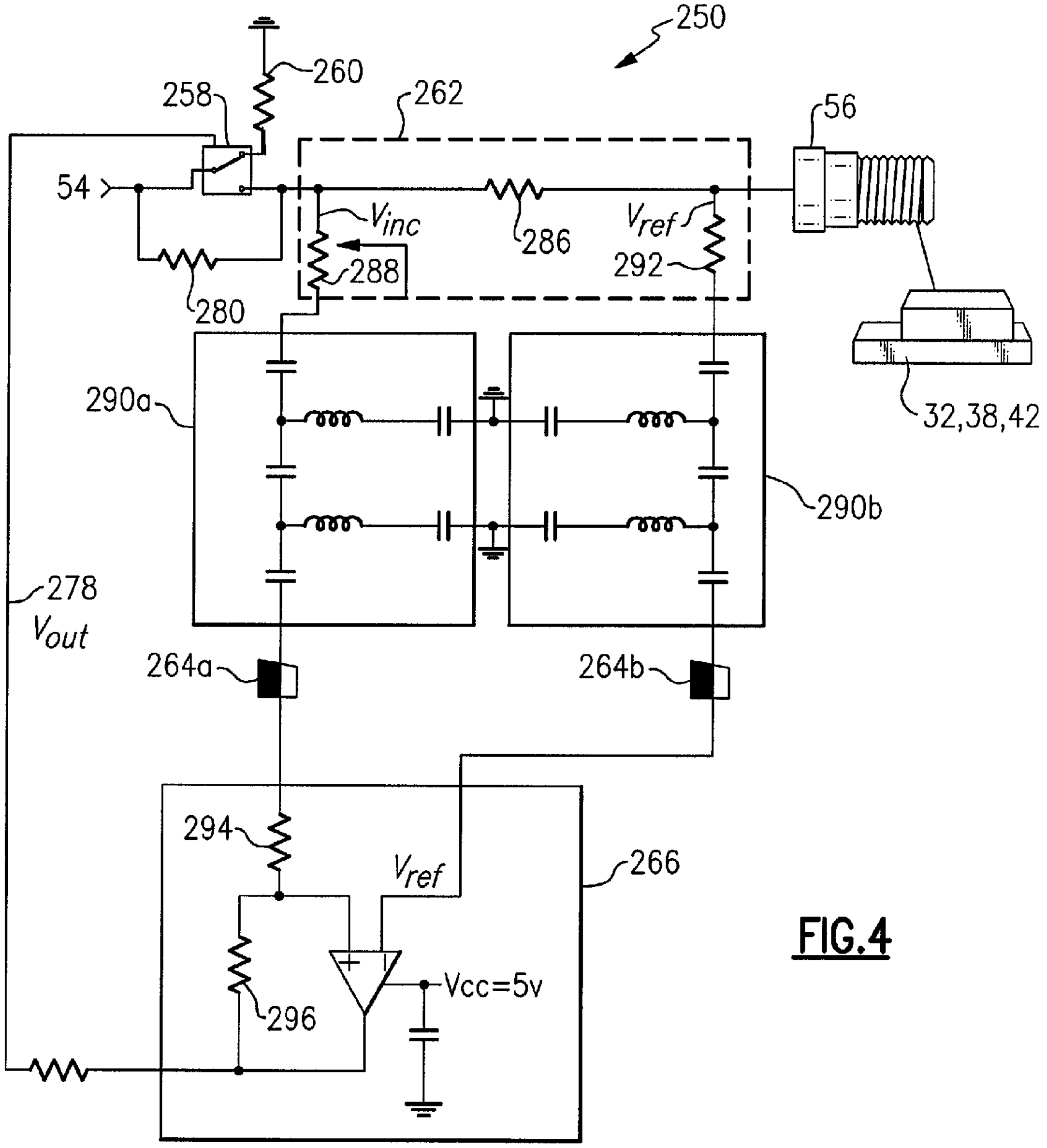
FIG. 4 shows a schematic diagram of an automatically terminating circuit according to a third embodiment of the invention.

Turning now to FIG. 4 of the drawings, wherein like numerals indicate like elements from FIG. 2, a circuit 250 for automatically terminating a user port in a coaxial cable system includes a signal path 252 extending from the supplier-side port 54 through an output of the user-side port 56. The signal path 252 includes a conductor, such as the center conductor in a coaxial cable, to carry the upstream and downstream bandwidth. The signal path 252 further includes a ground, such as the outer sheath of a coaxial cable that provides a path to ground with various cable connector devices. The circuit 250 further includes a switch 258, a termination resistor 260, and a feeding resistor 280, as detailed with respect to FIG. 2.

The circuit 250 further includes a passive signal sampler 262 comprising an attenuator 286, an adjustable measurement resistor 288, and a fixed measurement resistor 292. Two signals are output from the passive signal sampler 262, an incident voltage ($V_{inc}$) before the attenuator 286, and a reference voltage ($V_{ref}$) after the attenuator 286. The incident voltage signal $V_{inc}$ passes through a high pass filter 290*a* to assure only legitimate downstream bandwidths are compared, typically 50-1,000 MHz. The incident voltage signal may then be input to a rectifier 264*a*, such as a log detector or peak detector, to rectify the radio frequency signal to be able to measure the power content. The dc signal may also pass through a conditioning resistor 294 having a resistance value less than the attenuator 286 prior to the positive input leg of a comparator element 266. The circuit may further include a noise filtering resistor 296 having approximately the same resistance value as the attenuator 286.

The reference voltage signal ($V_{ref}$) also passes through a high pass filter 290*b* (typically 50-1,000 MHz) to assure only legitimate downstream bandwidths are compared. The reference voltage signal may then be input to a rectifier 264*b*, such as a log detector or peak detector, to obtain measurable and comparable content, for example. The signal is then input as the reference voltage to the comparator element 266.

In the disclosed example, if no user device is connected to the user-side port 56, the voltage drop across the attenuator 286 will be zero, and the output of the comparator element 266 will also be zero. There being no signal from the comparator element 266, the switch 258 remains in the open state, directing the downstream bandwidth to ground through the termination resistor 260. In the event a user device is subsequently connected to the user-side port 56, a small electrical current from the downstream bandwidth flows through the feeding resistor 280, causing a voltage drop across the attenuator 286. If a voltage drop across the attenuator 286 is detected, the output of the comparator element 266 changes from a zero to a one and an output voltage signal 278 ($V_{out}$) enables the switch 258 to move to the closed state, thereby allowing the downstream bandwidth into the user device.

Figure 5:
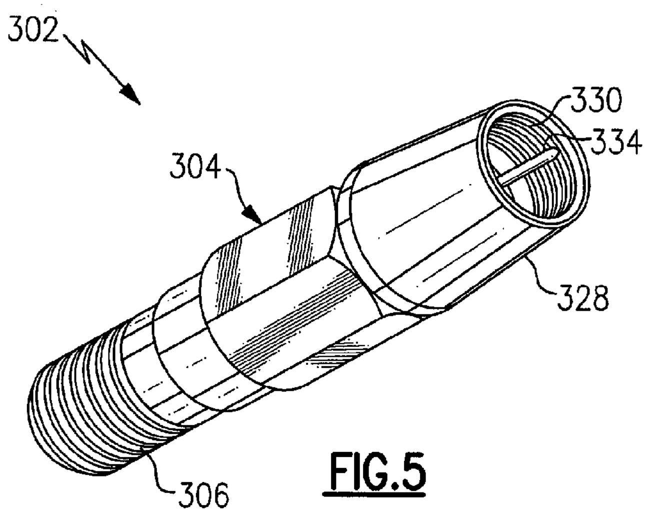
FIG. 5 shows a perspective view of a coaxial cable connector assembly with an automatically terminating circuit according to an embodiment of the invention.
Figure 6:
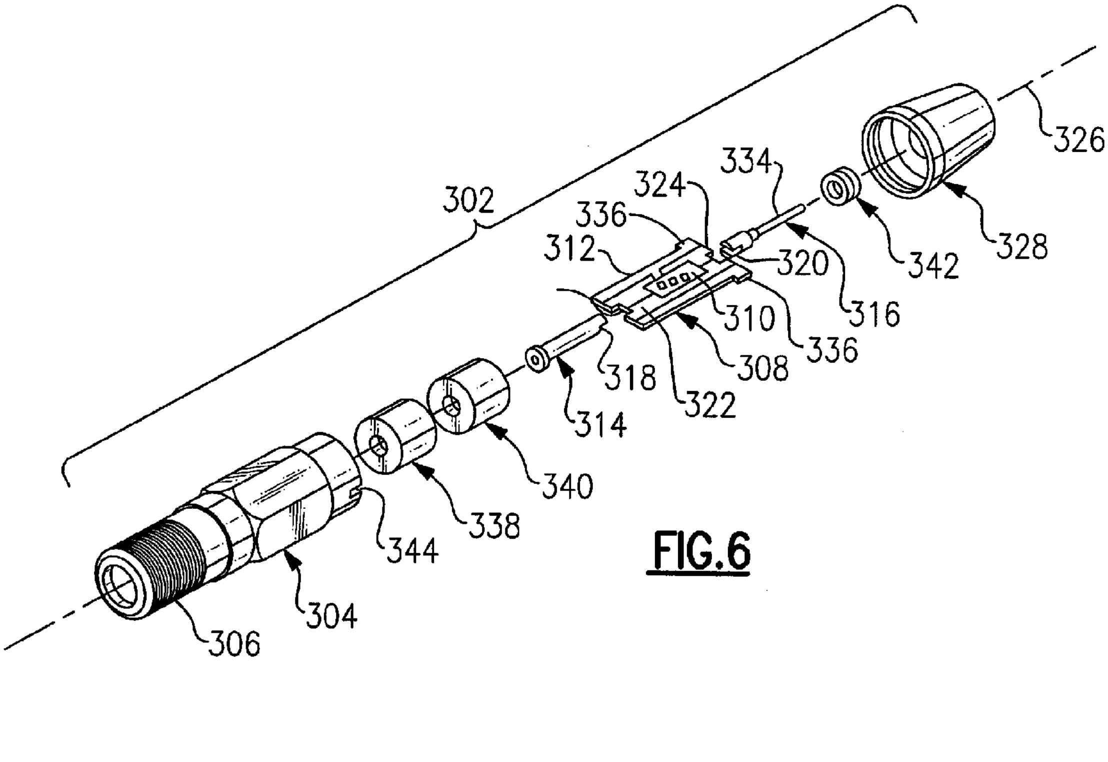
FIG. 6 shows an exploded perspective view of the coaxial cable connector assembly for the connector shown in FIG. 5.

The circuit of the present invention may be advantageously integrated into a coaxial cable connector, such as a tap, splitter, wall plate, or the like. Referring to FIGS. 5 and 6, a generic coaxial cable connector assembly 302 includes a body 304 shaped so as to provide a first cable connector 306 at an end thereof. In the exemplary embodiment, the body 304 has a male cable connector, but one of ordinary skill in the art can readily construct a body having alternate configurations, such as a female connector, a splitter, or a drop housing. The connector assembly 302 further includes a printed circuit board 308 having a circuit 310 for automatically terminating a user port in a coaxial cable system. The circuit 310 may be essentially as described hereinabove and illustrated in FIGS. 2, 3A, 3B, and 4. The circuit board 308 further includes a ground plane 312 for electrically coupling the circuit 310 to a ground path, which in the disclosed example is the connector body 304.

A pair of terminals 314 and 316 are electrically connected at opposite ends of the printed circuit board 308. Each of the terminals 314 and 316 has a slot (318 and 320, respectively) sized to receive a respective end (322 and 324, respectively) of the printed circuit board 308. Preferably, the slot is used to form a friction fit between the printed circuit board and the terminals during assembly. The terminals are then soldered to the printed circuit board 308. The ends 322 and 324 of the printed circuit board 308 have electrical contact pads thereon, for forming electrical contact with the terminals 314 and 316. When assembled, the terminals 314 and 316 are in line with the printed circuit board 308. That is, a longitudinal axis of each terminal 314, 316 passes through a central longitudinal axis 326 of the printed circuit board 308. The central longitudinal axis 326 of the printed circuit board 308 is centrally located with respect to both the width and thickness of the printed circuit board.

A nut 328 fits on an end of the body 304 opposite the cable connector 306 of the body. The nut 328 provides a second cable connector 330 at an end thereof opposite the first cable connector 306. Preferably, the connector 330 is of the opposite type from connector 306. For example, connector 306 is male, and connector 330 is female. The nut 328 is connected to the body 304 by solder 332 along a periphery of the nut to form a water tight seal. The exemplary nut 328 is formed from C36000 brass, (ASTM B16, ½ hard), but other materials may be used. Although the exemplary nut 328 has a conical shape, a variety of nut shapes may be used. For example, the nut may be cylindrical, conical, or may have two or more sections, each having a different shape (e.g. a cylindrical section and a conical section). Other shapes are also contemplated.

The ground plane 312 of the printed circuit board 308 is connected to an inner wall of the body 304 by solder 332.

Preferably, the solder 332 joining the nut 328 to the body 304 flows into, and is continuous with, the solder 332 connecting the ground plane 312 to the body 304.

The connector assembly 302 has an insulator 338, an elastomeric seal 340 at the end of the body 304 having the first connector 306. The insulator 338 may be formed of a polymer, such as natural TPX RT-18. The elastomeric seal 340 creates a water-tight seal between the body 304 and the terminal 314. The seal 340 may be formed of rubber, silicone, or other compressible insulating material. The exemplary seal 340 is formed from 30-40 durometer silicone rubber.

An insulator 342 is provided at the end of the nut 328 having the second connector 330 to create a water-tight seal between the nut 328 and the terminal 316. Insulator 342 may be formed of a polymer, such as polypropylene.

One of the terminals 316 is a male terminal having a pin 334 extending away from the printed circuit board 308. The other terminal 314 is a female terminal capable of receiving a cylindrical pin. The pin may be, for example, of the size and shape of pin 334, and the pin may belong to a cable connector having a connector end similar to connector 330. The terminals 314 and 316 may, for example, be formed from C36000 brass, ASTM B16, ½ hard, with the contacts of terminal 314 formed from beryllium copper alloy.

The printed circuit board 308 has at least one tab 336. The exemplary printed circuit board 308 has two tabs 336 on opposite sides thereof. The body 304 includes means for aligning the printed circuit board 308 in the body. A variety of alignment means may be used. In one example, the body 304 has a respective slot 344 for receiving each of the at least one tab(s) 336 on the printed circuit board 308, thereby aligning the printed circuit board 308 with the body 304, before and during subsequent soldering. Alignment of the printed circuit board 308 ensures that terminals 314 and 316 are aligned for proper mechanical fit within the insulators 338, 342 and elastomeric seal 340. The slots 344 provide mechanical support for the printed circuit board 308 and relieve the stress of the solder joints. The exemplary body 304 is formed from C36000 brass, (ASTM B16, ½ hard), but other materials may be used.

The circuits 50, 150, 250 disclosed herein may also be advantageously integrated into other coaxial cable connectors such as splitters (e.g., 26, 34), wall plates (e.g., 40), or drop taps (e.g., 16).

The circuits 50, 150, 155, 250 disclosed herein are not limited to the components shown. Electrical equivalents of the circuits 50, 150, 155, 250 may be utilized and other types and combinations of components that provide the desired functionality may be used consistent with the invention. It will also be appreciated that the circuits 50, 150, 155, 250 may be rendered in literally any physical form, including without limitation: (i) as a circuit composed of discrete circuit elements (i.e., resistors, capacitors and diodes); or (ii) as an integrated circuit, either in a stand-alone form or integrated with a parent device, such as with a splitter or tap device.

One advantage of the circuit disclosed herein is that, when installed in a splitter, the circuit increases the performance of the splitter by removing the reflections from the output ports. Removing reflections from open output ports increases the insertion loss characteristics of the splitter, leading to better performance.

While the present invention has been described with reference to a particular preferred embodiment and the accompanying drawings, it will be understood by those skilled in the art that the invention is not limited to the preferred embodiment and that various modifications and the like could be made thereto without departing from the scope of the invention as defined in the following claims.

I claim:

1. A circuit for automatically terminating a user port in a coaxial cable system, comprising:

a signal path extending from a user-side port toward a supplier-side port, the user-side port adapted to connect to a user device, the signal path comprising a conductor and a ground;

a passive signal sampler coupled to the signal path;

a comparator element in communication with the passive signal sampler, the comparator adapted to compare a line signal on the signal path to a reference signal and generate an output; and a switch disposed in the signal path having a first state for directing the line signal to a ground path and a second state for passing the line signal, the first state and the second state being responsive to the output generated from the comparator.

2. The circuit of claim 1, wherein the passive signal sampler is a directional coupler.

3. The circuit of claim 2 wherein the directional coupler is a bi-directional coupler.

4. The circuit of claim 3 wherein the bi-directional coupler is a four-port directional coupler comprising an input port, a transmitted port, a forward-coupled port coupled to a downstream bandwidth, and a reverse-coupled port coupled to a reverse path signal.

5. The circuit of claim 2 wherein the directional coupler comprises an input port, a transmitted port, an isolated port, and a coupled port coupled to an upstream bandwidth.

6. The circuit of claim 5 wherein the isolated port further comprises a resistor having a resistance value approximately equal to a characteristic impedance of a downstream bandwidth.

7. The circuit of claim 1, wherein the passive signal sampler comprises an attenuator, an adjustable measurement resistor, and a fixed measurement resistor.

8. The circuit of claim 7, wherein the attenuator is a resistor.

9. The circuit of claim 1, further comprising a controller for controlling the first state and the second state of the switch, responsive to the output of the comparator.

10. The circuit of claim 1 further comprising a feeding resistor coupled in parallel to the switch.

11. The circuit of claim 1 wherein the first state of the switch is the open state, and the second state of the switch is the closed state.

12. The circuit of claim 1 wherein the ground path includes a termination resistor.

13. The circuit of claim 12 wherein the termination resistor is impedance-matched to the supplier-side port.

14. The circuit of claim 13 wherein the resistance value of the termination resistor is 75 ohms.

15. The circuit of claim 1 wherein the switch is a single pole, single throw switch.

16. The circuit of claim 1 wherein the comparator element includes an amplifier.

17. A coaxial cable connector assembly comprising:

a printed circuit board having first and second opposed major surfaces and first and second opposing sides, the opposed major surfaces being substantially parallel to a single plane and being bisected by a longitudinal axis, the first and second opposing sides being substantially parallel to the longitudinal axis;

a signal path disposed on the printed circuit board, the signal path extending from an input portion toward an output portion;

a passive signal sampler coupled to the signal path;

a comparator element in communication with the passive signal sampler, the comparator adapted to compare a line signal on the signal path to a reference signal and generate an output;

a switch disposed in the signal path having a first state for directing the line signal to a ground path and a second state for passing the line signal, the first state and the second state being responsive to the output generated from the comparator;

a body that receives the printed circuit board, the body having a first end and a second end opposite the first end, the first end and second end shaped so as to receive a first cable connector and a second cable connector respectively;

an input terminal disposed within the body and in electrical contact with the input portion of the printed circuit board, the input terminal having an axis extending substantially parallel to the longitudinal axis; and an output terminal disposed within the body and in electrical contact with the output portion of the printed circuit board, the output terminal having an axis extending substantially parallel to the longitudinal axis.

18. The coaxial cable connector assembly of claim 17, further comprising a first insulator disposed in surrounding relation to the input terminal, and a second insulator disposed in surrounding relation to the output terminal.

19. The coaxial cable connector assembly of claim 17, wherein the body is a splitter.

20. The coaxial cable connector assembly of claim 17, further comprising a feeding resistor coupled in parallel to the switch.

21. The coaxial cable connector of claim 17, wherein the first state of the switch is the open state, and the second state of the switch is the closed state.

22. A method for automatically terminating a user port in a coaxial cable system, the method comprising the steps of:

providing a circuit comprising a signal path extending from a first port toward a second port, the first port carrying a bandwidth, the signal path comprising a conductor, a ground, and a switch disposed between the first port and the second port;

passively sampling the bandwidth;

comparing the sampled bandwidth to a reference value and, if the comparison exceeds a threshold value, positioning the switch to direct the signal path to the ground.

23. The method of claim 22, further comprising the step of positioning the switch to direct the signal path to the ground when the reference value drops below the threshold value.

24. The method of claim 23, further comprising the step of providing a feeding resistor in parallel with the switch, the feeding resistor adapted to pass a portion of the bandwidth power when the switch is open.

25. The method of claim 24 wherein the portion of the bandwidth power is less than approximately 20 dB.

26. The method of claim 22 wherein the step of passively sampling includes filtering the bandwidth.

27. The method of claim 26 wherein the step of filtering the bandwidth includes applying a high pass filter.

28. The method of claim 27 wherein the high pass filter attenuates frequencies less than approximately 50 megahertz.

29. The method of claim 22 wherein the step of passively sampling taps less than 10 dB of power from the bandwidth.

30. The method of claim 22 wherein the comparing step includes determining a voltage standing wave ratio.

31. The method of claim 30 wherein the threshold value is a voltage standing wave ratio greater than 1.5.

32. The method of claim 22 wherein the first port is a supplier-side port and the second port is a user-side port.

33. The method of claim 32 wherein the bandwidth is a downstream bandwidth having a range of frequencies between 50 megahertz and 1,005 megahertz.

34. The method of claim 22 wherein the first port is a user-side port.

35. The method of claim 34 wherein the bandwidth is an upstream bandwidth having a range of frequencies between 5 megahertz and 50 megahertz.

* * * * *